US 6,734,730 B2

(12) United States Patent
Doi et al.

(10) Patent No.: US 6,734,730 B2
(45) Date of Patent: May 11, 2004

(54) VARIABLE GAIN AMPLIFIER (75) Inventors: Takeshi Doi, Kokubunji (JP); Kenji Maio, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/308,003

(22) Filed: Dec. 3, 2002

(65) Prior Publication Data
US 2003/0155973 A1 Aug. 21, 2003

(30) Foreign Application Priority Data
Feb. 19, 2002 (JP) ..................................... P2002-041355

(51) Int. Cl.[7] ................................................. H03G 5/16
(52) U.S. Cl. ........................ 330/133; 330/295; 330/310
(58) Field of Search ............................. 330/133, 124 R, 330/150, 286, 295

(56) References Cited

U.S. PATENT DOCUMENTS

| 5,625,317 A | * | 4/1997 | Deveirman ................. 330/254 |
| 6,028,484 A | * | 2/2000 | Cole et al. .................. 330/295 |
| 6,137,355 A | * | 10/2000 | Sevic et al. ............. 330/124 R |

FOREIGN PATENT DOCUMENTS

| JP | 11-177357 | 12/1997 |
| JP | 11-284460 | 3/1998 |
| JP | 2001-223549 | 2/2000 |

* cited by examiner

Primary Examiner—Khanh Van Nguyen
(74) Attorney, Agent, or Firm—Reed Smith, LLP; Stanley P. Fisher, Esq.; Juan Carlos A. Marquez, Esq.

(57) ABSTRACT

In order to provide a high sensitivity variable gain amplifier, there is provided a structure in which at least one path comprising at least a stage of the voltage-input/voltage-output amplifier+ a stage of voltage-input/current-output amplifier and a path comprising a stage of the voltage-input/current-output amplifier are connected in parallel between the input terminal and output terminal or, a structure in which a plurality of paths each comprising at least a stage of voltage-input/voltage-output amplifier+a stage of voltage-input/current-output amplifier are connected in parallel between the input terminal and output terminal. A gain is switched by selecting and operating any one of paths. When any one path is selected, an input impedance viewed from the input terminal is suppressed almost not to change or an output impedance viewed from the output terminal is suppressed almost not to change. Thereby, a high sensitivity wireless receiver can be realized.

20 Claims, 6 Drawing Sheets

Prior Art

FIG. 10

Prior Art

FIG. 11

VARIABLE GAIN AMPLIFIER

BACKGROUND OF THE INVENTION

The present invention relates to an amplifier for switching a gain depending on the level of an input signal, and particularly to a variable gain amplifier which can be effectively applied to a receiver for wireless communication.

In a wireless mobile communication system such as a mobile telephone or the like which has already formed a wide industrial market, communications are realized using the frequency of GHz band. An amplifier of the receiver used in the GHz band for wireless communication is designed to assure high sensitivity and to obtain good linearity. For example, an amplifier, which can switch the gain thereof, namely provide a high gain when an input signal is low level and a low gain when an input signal is high level, is employed. With the switching of gain, distortion of signal due to saturation of circuit can be suppressed and more excellent linearity can be obtained.

Figure 9:
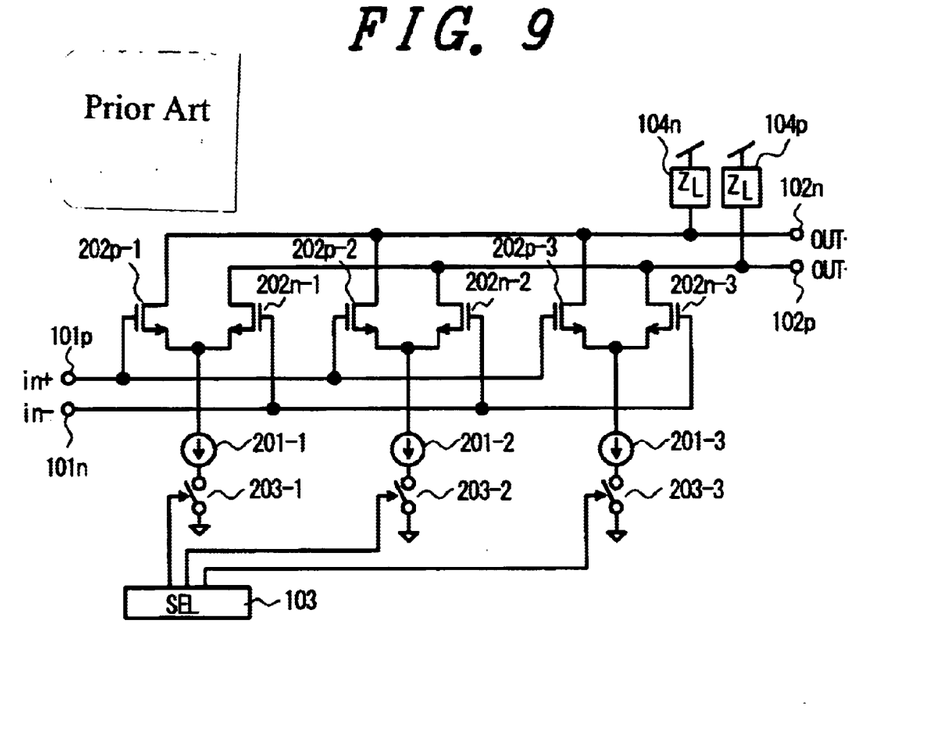
FIG. 9 is a circuit diagram for explaining the first example of the variable gain amplifier of the prior art.

The first example of the existing gain switching amplifier, namely variable gain amplifier is illustrated in FIG. 9. In this example, the current sources 201-1, 201-2, 201-3 of different current values are switched with the ON/OFF operation of the switches 203-1, 203-2, 203-3 under the control of a selection circuit (SEL) 103 for three differential amplifiers consisting of loads ($Z_L$) 104p, 104n, transistors 202p-1, 202n-1, transistors 202p-2, 202n-2 and transistors 202p-3, 202n-3. A differential input signal to the input terminals 101p, 101n is amplified and outputted to the output terminals 102p, 102n.

A gain of amplifier is determined with product of a mutual conductance gm of transistor and an impedance of a load 104, but since the mutual conductance gm corresponds to an operation current of transistor, a gain of amplifier can be switched through the switching of a current source 201. Since the mutual conductance gm also corresponds to an element size of transistor, a method for switching the gain by introducing transistors of different sizes into the three differential amplifiers can also be introduced. The amplifier for switching a current or a size of element is disclosed, for example, in the Japanese Patent Laid-Open (Kokai) No. Hei 11-177357. In above amplifier, since constants of a transistor change depending on the switching of a current or an element size, an input impedance and an output impedance of the amplifier change whenever the switching is conducted.

Figure 10:
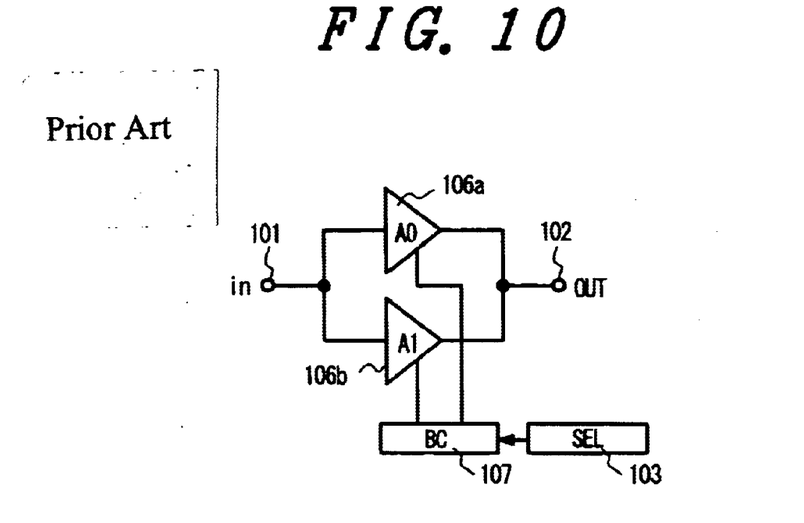
FIG. 10 is a structural diagram for explaining the second example of the variable gain amplifier of the prior art.

The second example of the existing gain switching amplifier is illustrated in FIG. 10. This amplifier includes, between the input terminal 101 and output terminal 102, a plurality of paths consisting of a voltage-input/voltage-output type amplifier (hereinafter referred to as V—V amplifier) 106a of the gain A0 and a V—V amplifier 106b of the gain A1 (A0>A1).

The selection circuit 103 obtains information of an input signal amplitude from an external circuit of the amplifier and controls a bias circuit (BC) 107. When the input signal amplitude is low, the selection circuit 103 supplies a bias voltage to the V—V amplifier 106a of high gain from the bias circuit 107 to select the path including the V—V amplifier 106a of high gain by cutting the bias voltage of the V—V amplifier 106b of low gain. When the input signal amplitude is high, the path including the V—V amplifier 106b of low gain is selected. Such amplifier is disclosed in the Japanese Patent Laid-Open (Kokai) No. 2001-223549. Even in this example, since the mutual conductance gm is varied by changing an element size of transistor forming the amplifier 106 or a current flowing into the transistor, the input impedance and output impedances when the gain is switched vary to a large extent.

Figure 11:
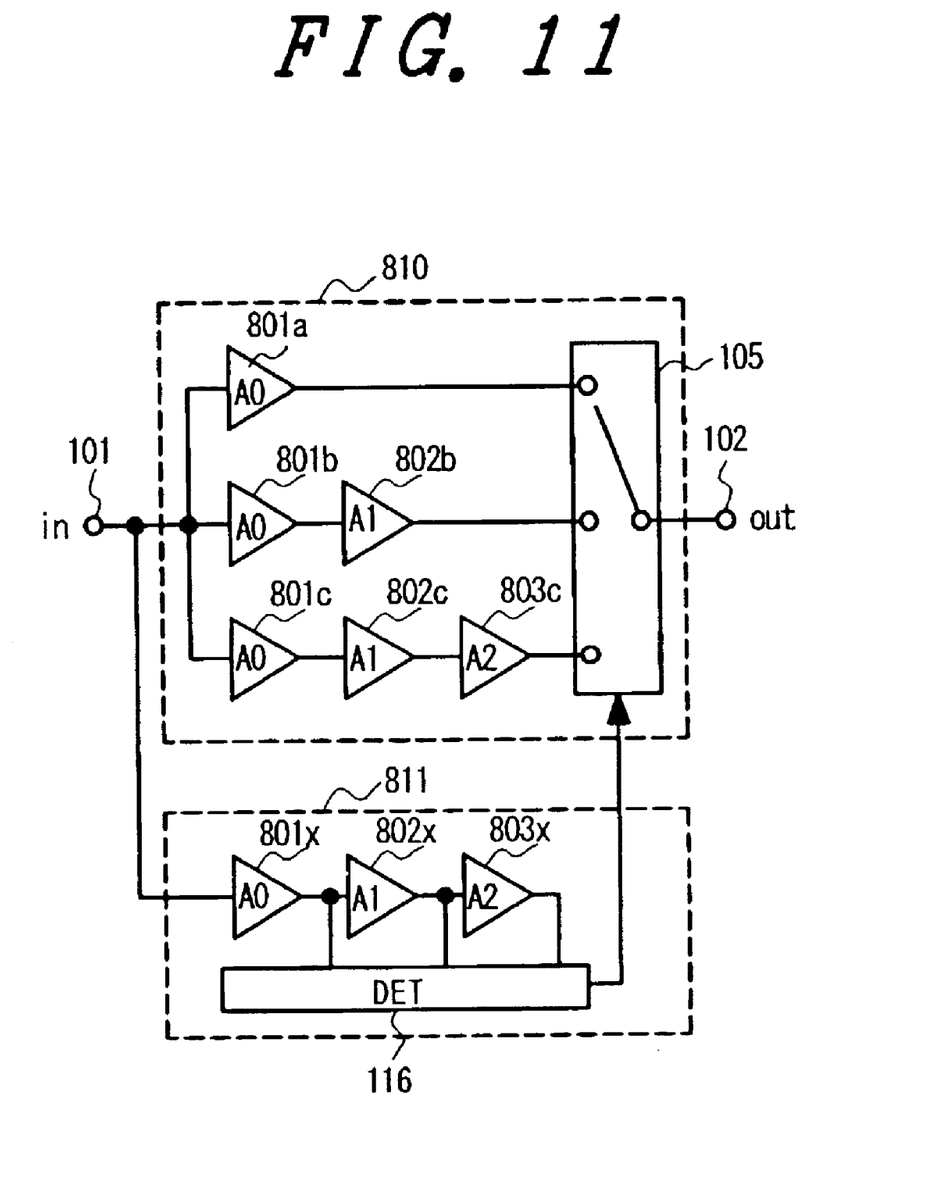
FIG. 11 is a structural diagram for explaining the third example of the variable gain amplifier of the prior art.

As the third example of the existing gain switching amplifier, the amplifier disclosed in the Japanese Patent Laid-Open (Kokai) No. Hei 11-284460 is illustrated in FIG. 11. This example is constituted of an amplifier unit 810 and a level detecting unit 811 having a plurality of paths allocated between the input terminal 101 and output terminal 102 via a change-over switch 105, namely a path of the V—V amplifier 801a, a path of cascade connection of the V—V amplifier 801b and V—V amplifier 802b and a path of cascade connection of the V—V amplifier 801c, V—V amplifier 802c and V—V amplifier 803c. The V—V amplifier 801 has the gain A0, while the V—V amplifier 802 has the gain A1 and the V—V amplifier 803 has the gain A2, respectively.

The level detecting unit 811 is constituted of the path of cascade connection of the V—V amplifier 801x, V—V amplifier 802x and V—V amplifier 803x having the identical electrical characteristics as those explained above and a level detector (DET) 116. Any path of the amplifier unit 810 is selected depending on the detection result.

The circuit of this example changes an input impedance and an output impedance through the switching as in the case of the first and second examples. An input impedance changes at a higher frequency influenced by a coupling capacitance between the input side and output side when a load side of a preamplifier 801 changes with the switching operation. Moreover, since this example is based on the installation of the level detecting unit 811 using the same V—V amplifier as the amplifier unit 810 from the structural viewpoint, physical configuration of circuit becomes large and a current dissipation is also large and moreover installation of the change-over switch 105 accompanied by deterioration of signal is essential.

SUMMARY OF THE INVENTION

In a receiver for wireless communication, it is very important that impedance matching is attained between a variable gain amplifier and a preceding stage thereof (for example, antenna) and impedance matching is also attained between the variable gain amplifier and a subsequent stage thereof (for example, mixer). If such impedance matching is not attained, signal loss and noise increase due to generation of reflection in the signal to be transmitted and thereby sensitivity is deteriorated.

In the existing variable gain amplifier explained above, it is not considered that unmatching is generated due to the change of input and output impedances when the switching of gain is conducted. Particularly, in the method for changing a circuit parameter such as an element size or a current flowing into the element, an input impedance and an output impedance change largely. Therefore a degree of mismatching becomes large in order to change the gain.

Moreover, deterioration of sensitivity due to the switching loss cannot be neglected in the system for changing the path with a switch connected in series to the signal path.

It is therefore an object of the present invention to provide a high sensitivity variable gain amplifier which can maintain the excellent matching condition by suppressing an impedance change due to the switching of gain.

The object of the present invention can be effectively achieved by introducing a structure in which at least one path comprising at least a stage of the voltage-input/voltage-output amplifier+a stage of voltage-input/current-output amplifier and a path comprising a stage of the voltage-input/current-output amplifier are connected in parallel between the input terminal and output terminal or, a structure in which a plurality of paths each comprising at least a stage of voltage-input/voltage-output amplifier+a stage of voltage-input/current-output amplifier are connected in parallel between the input terminal and output terminal, and by switching the gain by selecting and operating any one path among the paths explained above. And then, it is desirable to keep, even when any path is selected, the input impedance viewed from the input terminal almost unchanged or the output impedance viewed from the output terminal unchanged.

An input impedance and an output impedance explained above can be realized, for example, on selecting any one of paths through control of bias voltages given to control electrodes of transistors forming a voltage-input/voltage-output amplifier and a voltage-input/current-output amplifier, by equalizing an element size of an input transistor connected to the input terminal, the input transistor being included in the transistors, and also equalizing a bias voltage when the path is selected given to the control electrode of the input transistor, or by equalizing an element size of an output transistor connected to the output terminal, the output transistor being included in the transistors, and also equalizing a bias voltage when the path is selected given to the control electrode of the output transistor, or by introducing a cascode structure of transistor.

These and other objects and many of the attendant advantages of the invention will be readily appreciated as the same becomes better understood by reference to the following detailed description when considered in connection with the accompanying drawings.

DETAILED DESCRIPTION OF THE PREFERRED EMBODIMENTS

A variable gain amplifier of the present invention will be explained in detail with reference to some preferred embodiments illustrated in the drawings.

Figure 1:
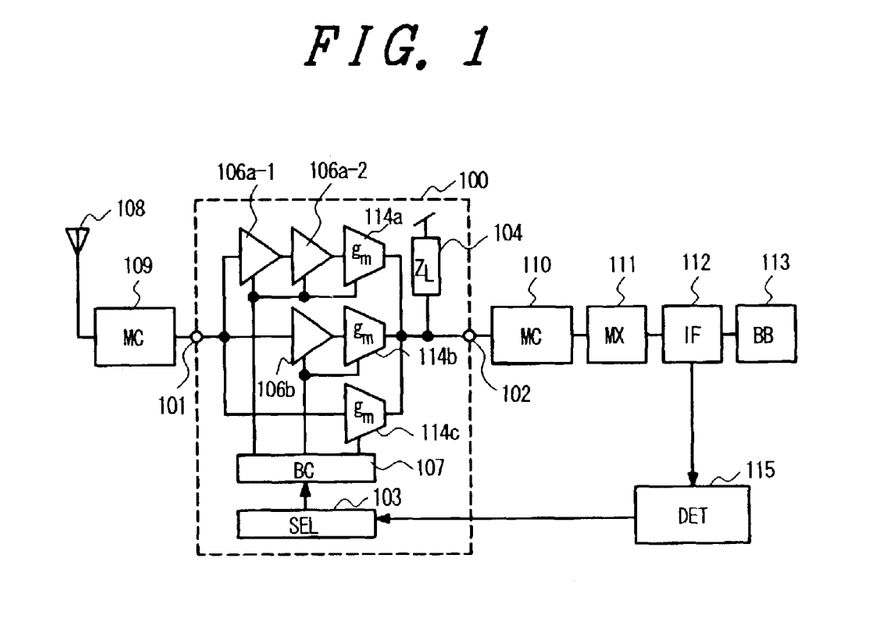
FIG. 1 is a structural diagram for explaining the first embodiment of a variable gain amplifier of the present invention.

The first embodiment of the variable gain amplifier of the present invention and an example of a receiver for wireless communication using the same amplifier are illustrated in FIG. 1. In FIG. 1, 100 designates a variable gain amplifier of the first embodiment. 109, a matching circuit for impedance matching between an antenna 108 and a variable gain amplifier 100; 111, a mixer (MX) for converting frequency of the signal amplified with the variable gain amplifier 100; 110, a matching circuit for impedance matching between the variable gain amplifier 100 and mixer 111; 112, an IF circuit for processing an IF signal of the intermediate frequency (IF) band frequency-converted with the mixer 111; 113, a baseband signal processing circuit (BB) for processing a baseband signal generated with process of the IF circuit 112; 115 an amplitude detecting circuit (DET) for detecting amplitude of the IF signal in the intermediate frequency band.

Such receiver receives, for example a signal transmitted through a wireless channel and executes signal process to provide the data obtained with such signal process to an external personal computer.

An amplifier unit of the variable gain amplifier 100 is constituted of the first path (high gain) formed of cascade connection of two stages of the V—V amplifiers 106a-1, 106a-2 and a stage of the voltage-input/current-utput type amplifier (hereinafter referred to as V-I amplifier) 114a, the second path (intermediate gain) formed of cascade connection of a stage of the V—V amplifier 106b and a stage of the V-I amplifier 114b, the third path (low gain) of a stage of the V-I amplifier 114c and a load ($Z_L$) allocated between the input terminal 101 and the output terminal 102. To the V—V amplifier 106 and V-I amplifier 114, a bias voltage is supplied from a bias circuit 107 controlled by the selection circuit 103.

A signal for switching the signal path of amplifier is determined, for example, as explained below. First, under the condition that the path is set to the third path of low gain, the signal detecting circuit 115 detects the maximum amplitude value of the IF signal and outputs a control signal for selecting the high gain path when the maximum value is less than the first threshold value (Vth1), outputs a control signal for selecting the intermediate gain path when the maximum value is the first threshold value or higher but is less than the second threshold value (Vth2>Vth1) and outputs a control signal for low gain when the maximum value is the second threshold value or higher.

The selection circuit 103 receives a control signal for gain selection to set a bias voltage of the bias circuit 107. The bias voltage is supplied to the V—V amplifier 106 and V-I amplifier 114 so that the selected path is set to the operating condition while the other paths are set to the non-operating condition in the bias circuit 107.

A signal path switching signal can also be determined, not depending on the method explained above, by changing the path from the higher gain side or from the lower gain side and then outputting a selection signal to determine the path when the predetermined amplitude is obtained.

When any path is selected in above signal path switching, circuit parameters are selected so that the input impedance Zin of the variable gain amplifier 100 viewed from the input terminal 101 becomes almost equal. Therefore matching between the input impedance Zin and an output impedance in the side of antenna 108 can be performed stably with the matching circuit 109 without change thereof due to the switching operation.

Even when any path is selected, circuit parameters are selected so that the output impedance Zout of the variable gain amplifier viewed from the output terminal 102 becomes almost equal, and matching between the output impedance Zout and an input impedance in the side of mixer 111 can be performed stably with the matching circuit 110 without change thereof due to the switching operation.

Here, a method of determining the circuit parameters for suppressing change of input impedance due to the gain switching operation will be explained. Since the input impedance of amplifier 100 is changed depending on parasitic capacitance between the control electrode and the ground electrode of a transistor and parasitic capacitance between the control electrode and output electrode, change of impedance can be suppressed by suppressing the change of input capacitance when the path is switched.

An input impedance and an output impedance of a variable gain amplifier having two paths will be explained in general.

First, a calculation example of an input impedance, namely an input capacitance due to the switching of path will be explained below for a common-source amplifier illustrated in FIG. 2 utilizing an NMOS (N-type Metal Oxide Semiconductor) as the input transistor connected to the input terminal 101.

Figure 2:
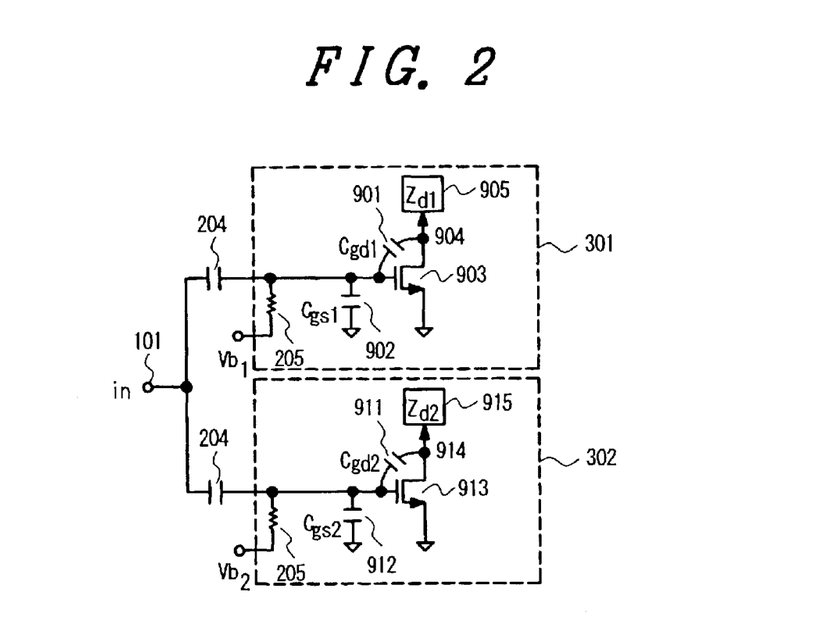
FIG. 2 is a circuit diagram for explaining an input impedance of the variable gain amplifier of the present invention.

In FIG. 2, 204 is a capacitor for AC coupling; 903, 913 are NMOS transistors as input transistors; 205, a high impedance element for DC coupling of the bias circuit 107 and gate electrodes of the NMOS transistors 903, 913; 301, 302, are respectively a part of the preamplifier of the first and second paths. Moreover, for the transistors 903, 913, 904, 914 are drain electrodes; 902, 912 are capacitances ($C_{gs1}$, $C_{gs2}$) between the gate electrode and the ground; 901, 911 are capacitances ($C_{gd1}$, $C_{gd2}$) between the gate electrode and drain electrode; 905, 915 are loads having the impedances of $Z_{d1}$, $Z_{d2}$ respectively connected to the drain electrode; $V_{b1}$, $V_{b2}$ are bias voltages. In this example, an input capacitance $C_1$, of the preamplifier when the first path is selected and an input capacitance $C_2$ of the preamplifier when the second path is selected may be approximately expressed as follows.

$C_1 \approx C_{gs1} + C_{gs2} + C_{gd1}(1+g_{m1}Z_{d1})$ $C_2 \approx C_{gs1} + C_{gs2} + C_{gd2}(1+g_{m2}Z_{d2})$ Here, $g_{m1}$, $g_{m2}$ are respectively mutual conductances of the transistors 903, 913 when the first path and second path are respectively selected, and it is also assumed that only the transistor of the selected path is in the ON state while the transistor of the path not-selected is in the OFF state.

From the above formulae, the condition for $C_1 \approx C_2$ is as follows.

$C_{gd1}(1+g_{m1}Z_{d1}) \approx C_{gd2}(1+g_{m2}Z_{d2})$

In above relationship, $C_{gd1}$, $C_{gd2}$ are almost proportional to the gate width of MOS transistor. Moreover, $g_{m1}$, $g_{m2}$ are determined by an element size of MOS transistor. $Z_{d1}$, $Z_{d2}$ can approximately be replaced with values of load resistance (in the case of cascode structure, an inverse number of the mutual conductance of the cascode transistor). Change of input impedance due to the switching of path can be suppressed by selecting these circuit parameters to satisfy the conditions explained above.

Next, a method of suppressing change of output impedance due to the switching of gain will be explained. An example of calculating an output impedance due to the switching of the path for the common-source amplifier illustrated in FIG. 3 using the NMOS transistor as the output transistor of the final stage amplifiers 114a, 114b will be explained below.

Figure 3:
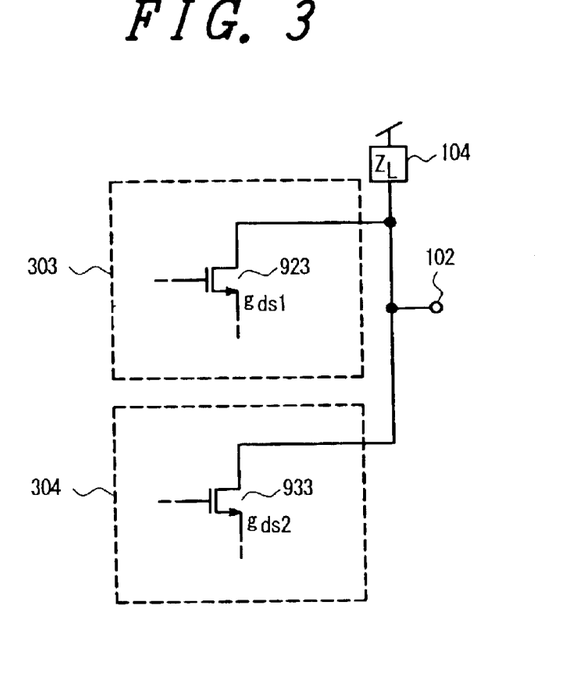
FIG. 3 is a circuit diagram for explaining an output impedance of the variable gain amplifier of the present invention.

In FIG. 3, 303, 304 are respectively part of the final stage amplifiers of the first and second paths. Numerals 923, 933 are output transistors connected to the output terminal 102. In this example, the output impedances $Z_1$, $Z_2$ of the first and second paths can be approximately expressed as follows.

$Z_1 \approx 1/\{(1/Z_L) + g_{ds1}\}$ $Z_2 \approx 1/\{(1/Z_L) + g_{ds2}\}$

Here, $g_{ds1}$, $g_{ds2}$ are respectively drain conductances of the transistors when the first and second paths are selected. It is assumed that only the transistor of the selected path is in the ON state, while the transistor of the non-selected path is in the OFF state. From these formulae, change of output impedance due to the switching of path can be suppressed by selecting a size of the MOS transistor to provide $g_{ds1} \approx g_{ds2}$.

In this method, it is possible to suppress change of output impedance with higher accuracy up to the higher frequency by considering the coupling between the drain electrode and gate electrode, and moreover an influence of impedance of the circuit connected to the gate electrode and source electrode.

Since the path of low gain is formed of the single stage of V-I amplifier and the path of high gain is formed of the cascade connection of the multiple stage V—V amplifiers and V-I amplifier in the switching method of the present invention, the V—V amplifier and V-I amplifier of each path can be formed almost in the same element size not depending on the gain. Therefore, the amplifier of this embodiment has a structure to easily suppress deviation of impedance. Moreover, a variable range of gain can be widened by increasing the number of stages of the path of high gain. In addition, a current dissipation can be optimized by changing the number of stages of cascade connection depending on the gain and by intermitting the flow of current to the amplifier of the non-selected path.

In this embodiment, three paths are used as illustrated in FIG. 1, although the present invention is never limited thereto and it is also possible to introduce a plurality of paths other than the three paths.

Figure 4:
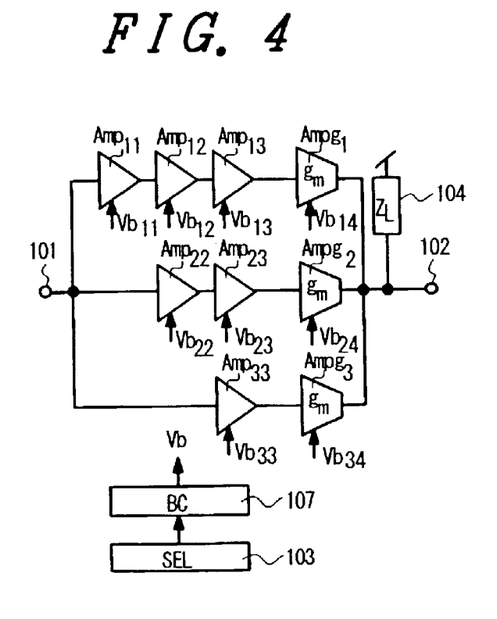
FIG. 4 is a structural diagram for explaining the second embodiment of the variable gain amplifier of the present invention.

The second embodiment of the present invention is illustrated in FIG. 4. The variable gain amplifier of this embodiment is capable of suppressing change of input impedance and output impedance when the gain is switched by aligning sizes of amplifier elements and bias voltages of the V—V amplifier or V-I amplifier. When the sizes and bias voltages are aligned, the circuit parameter such as mutual conductance of amplifier element becomes identical.

In FIG. 4, $Amp_{ij}$ (i, j are positive integers) is a V—V amplifier, $Ampg_i$ is a V-I amplifier, $Vb_{ij}$ is a bias voltage. The first path (high gain) is formed of the cascade connection of the V—V amplifiers $Amp_{11}$, $Amp_{12}$, $Amp_{13}$ and V-I amplifier $Ampg_1$. The second path (intermediate gain) is formed of the cascade connection of the V—V amplifier $Amp_{22}$, $Amp_{23}$ and V-I amplifier $Ampg_2$. The third path (low gain) is formed of the cascade connection of the V—V amplifier $Amp_{33}$ and V-I amplifier $Ampg_3$.

Element sizes of the preamplifiers of respective paths are set identical to value ($Amp_{11} = Amp_{22} = Amp_{33}$) and the bias voltages are also set to the identical value ($Vb_{11} = Vb_{22} =$ $Vb_{33}$). Thereby, when any path is selected, the input impedance can be set to the identical value.

Moreover, the output impedance can be set almost to the equal value even when any path is selected by setting the element of the final stage amplifier of each path to the identical value ($Ampg_1$=$Ampg_2$=$Ampg_3$), and also setting the bias voltage when the path is selected to the identical value ($Vb_{14}$=$Vb_{24}$=$Vb_{34}$). In this embodiment, the amplifier of the low gain path is formed of the V—V amplifier and V-I amplifier but this amplifier can also be formed only of the V-I amplifier. In this case, the size selecting method explained above can be introduced in direct by using the V-I amplifier+load resistance $Z_L$ as the preamplifier.

In this embodiment, the effect for sauppressing change of impedance when the path is switched can be enhanced more than that of the first embodiment.

Moreover, change of input impedance when the path is switched can further be suppressed by equalizing the size and bias voltage of not only the preamplifier but also the amplifiers of the subsequent stages. For example, the size and bias voltage of the V—V amplifier of the first stage of each path are aligned, the size and bias voltage of the V—V amplifier of the next stage of the first and second paths are also aligned ($Amp_{12}$=$Amp_{23}$, $Vb_{12}$=$Vb_{23}$), and the matching circuits 109, 110 are aligned with the first and second paths. With introduction of such structure, change of impedance when the first and second paths are switched can further be suppressed. Moreover, since the size and bias voltage of all V—V amplifiers and V-I amplifiers of each path are aligned, the more the suppression effect may be enhanced, the more the number of stages in the path increases.

In this embodiment, three paths are used but the present invention is not limited thereto and it is also possible to use a plurality of paths other than three paths.

Figure 5:
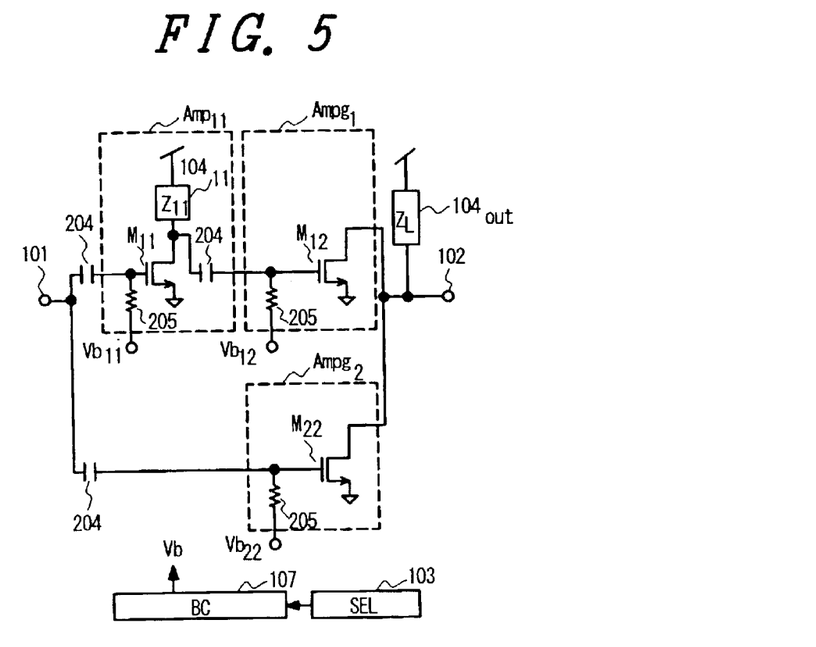
FIG. 5 is a circuit diagram for explaining the third embodiment of the variable gain amplifier of the present invention.

As the third embodiment of the present invention, an example of the variable gain amplifier which is structured with MOS transistor by introducing the characteristics of the first and second embodiments will be illustrated in FIG. 5. In this embodiment, the two systems of path are provided in the first embodiment and the element sizes and bias voltages of MOS transistors are set to the identical value like the second embodiment.

In FIG. 5, $M_{ij}$ is a MOS transistor; $Z_{11}$, $Z_L$ are respectively impedances of the load 104$_{11}$, 104$_{out}$. The first path (high gain) is constituted of the cascade connection of the V—V amplifier $Amp_{11}$ and V-I amplifier $Ampg_1$, while the second path (low gain) is constituted of the V-I amplifier $Ampg_2$.

The sizes of MOS transistors, bias voltages when the path is selected and load impedances are all set to the identical value ($M_{11}$=$M_{12}$=$M_{22}$, $Vb_{11}$=$Vb_{12}$=$Vb_{22}$, $Z_{11}$=$Z_L$).

For the setting of high gain, the bias voltages $Vb_{11}$, $Vb_{12}$ are set to allow the predetermined current to flow into the transistors $M_{11}$, $M_{12}$, and the bias voltage $Vb_{22}$ becomes equal to the ground potential. For the setting of low gain, the bias voltage $Vb_{22}$ is set to allow the predetermined current to flow into the transistor $M_{22}$, and the bias voltages $Vb_{11}$, $Vb_{12}$ becomes equal to the ground potential.

In the switching method of this embodiment, since the switch is not turned ON to the signal path, the switch circuit of low loss can be realized.

Figure 6:
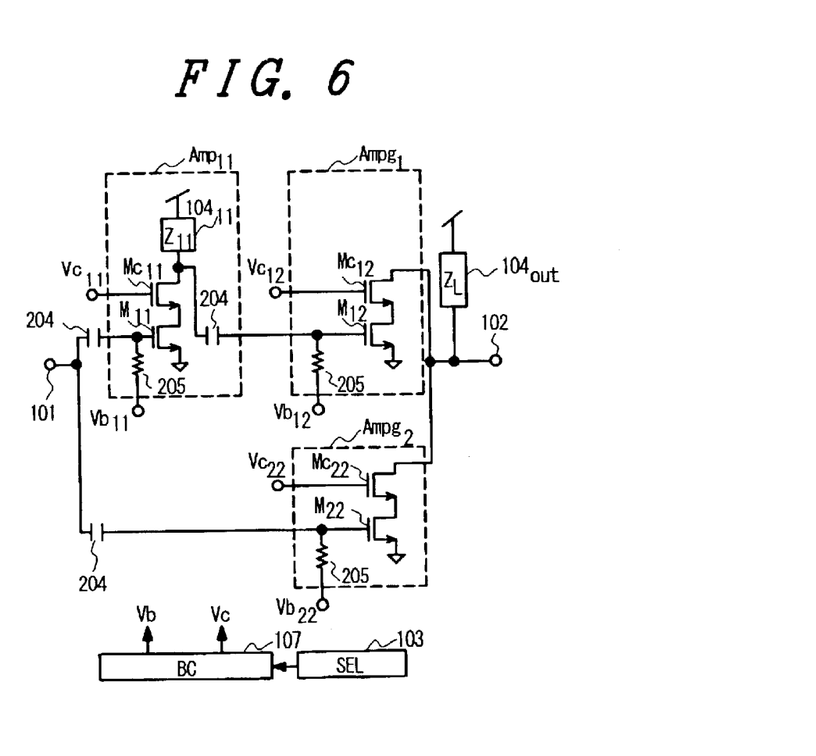
FIG. 6 is a circuit diagram for explaining the fourth embodiment of the variable gain amplifier of the present invention.

As the fourth embodiment of the present invention, an example of the variable gain amplifier using the V—V amplifier and V-I amplifier of the cascode structure is illustrated in FIG. 6. $M_{ij}$ is a grounded-source transistor and $Mc_{ij}$ is a cascode transistor.

The first path (high gain) is formed of the cascade connection of the V—V amplifier $Amp_{11}$, and V-I amplifier $Ampg_1$, while the second path (low gain) is formed of the V-I amplifier $Ampg_2$.

The sizes of MOS transistors of the V—V amplifier and V-I amplifier of each path and the bias voltages when the path is selected and load impedances are all set to the identical values ($M_{11}$=$M_{12}$=$M_{22}$, $M_{11}$=$Mc_{12}$=$Mc_{22}$$Vb_{11}$=$Vb_{12}$=$Vb_{22}$, $Vc_{11}$=$Vc_{12}$=$Vc_{22}$, $Z_{11}$=$Z_L$).

The path can be switched by controlling the gate electrode of the cascode transistor Mc. For example, for the setting of high gain, the gate electrodes of the cascode transistors $Mc_{11}$, $Mc_{12}$ of the high gain path is set to about (drain-source voltage with which the common-source MOS transistor M is brought to the saturation range)+(threshold voltage of the cascode transistor Mc) and the gate electrode of the cascode transistor $Mc_{22}$ of the low gain path is set to the ground potential. In this case, it is also possible that the bias voltage of the common-source MOS transistor M is controlled as explained in regard to the third embodiment. Moreover, it is also allowed that the bias voltage to be applied to the gate electrode of the cascode transistor Mc and the bias voltage of the common-source MOS transistor M are controlled simultaneously.

In the variable gain amplifier of this embodiment, since the input and output of the V—V amplifier and V-I amplifier are electrically isolated to a large extent with the cascode transistor Mc, change of impedance when the path is switched can be set smaller than that of the circuit in the third embodiment.

In this embodiment, the V—V amplifier and V-I amplifier are all formed in the cascode structure, but the present invention is not limited thereto and it is also allowed that a part of the invention is formed in the cascode structure and the other is formed in the single stage of transistor like the third embodiment.

Figure 7:
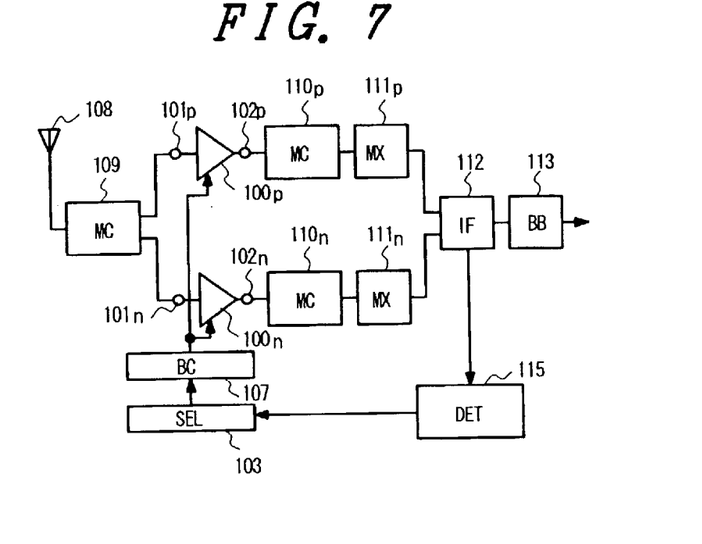
FIG. 7 is a structural diagram for explaining the fifth embodiment of the variable gain amplifier of the present invention.

The fifth embodiment of the present invention will be explained. An example of the receiver for wireless communication using the variable gain amplifier in which a couple of the variable gain amplifiers of the third or fourth embodiment are introduced as differential input and output is illustrated in FIG. 7. To the two variable gain amplifiers 100*p*, 100*n*, a positive signal and a negative signal are respectively inputted. In the selection circuit 103, the variable gain amplifier of the differential input and output can be realized by setting two variable gain amplifiers 100 in the same gain depending on the control signal of the amplitude detecting circuit 115.

In above first embodiment to fifth embodiment, a MOS transistor has been used as the transistor but the same effect can also be obtained by utilizing the bipolar transistor and MEFET (Metal Semiconductor Field Effect Transistor).

Moreover, an example of the common-source amplifier is explained as the V—V amplifier and V-I amplifier but the identical effect can also be attained by using a differential amplifier.

Figure 8:
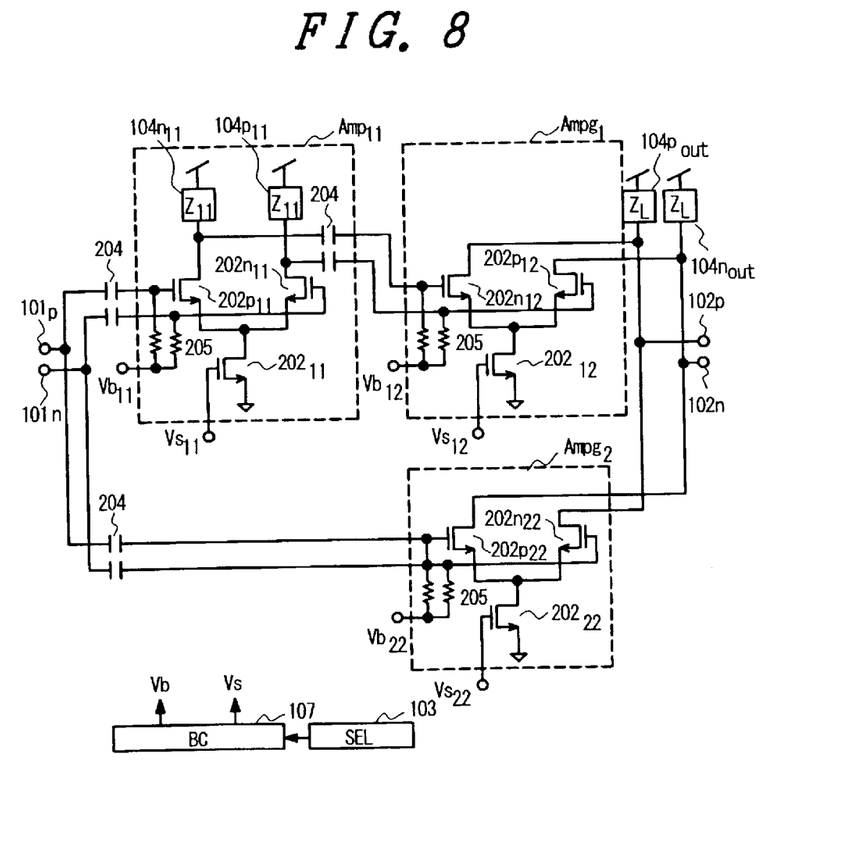
FIG. 8 is a circuit diagram for explaining the sixth embodiment of the variable gain amplifier of the present invention.

As the sixth embodiment of the present invention, an example of the variable gain amplifier using the differential amplifier is illustrated in FIG. 8. The V—V amplifier $Amp_{11}$ is constituted of the MOS transistors 202$p_{11}$, 202$n_{11}$ which are driven with the MOS transistor 202$_{11}$ used as a current source. The bias voltage $Vs_{11}$, is given to the transistor 202$_{11}$, and the bias voltage $Vb_{11}$ to the transistors 202$p_{11}$, 202$n_{11}$.

The V-I amplifier Ampg1 is constituted of the MOS transistors 202$p_{12}$, 202$n_{12}$ which are driven with the MOS transistor 202$_{12}$ as the current source. The bias voltage $Vs_{12}$ is given to the transistor 202$_{12}$, while the bias voltage $Vb_{12}$ to the transistors 202$p_{12}$, 202$n_{12}$.

The V-I amplifier Ampg$_2$ is constituted of the MOS transistors $202p_{22}$, $202n_{22}$ which are driven with the MOS transistor $202_{22}$ as the current source. The bias voltage Vs$_{22}$ is given to the transistor $202_{22}$, while the bias voltage Vb$_{22}$ to the transistors $202p_{22}$, $202n_{22}$.

The first path (high gain) is formed of the cascade connection of the V—V amplifier Amp$_{11}$, and V-I amplifier Ampg$_1$ and the second path (low gain) is formed of the V-I amplifier Ampg$_2$.

In this embodiment, the path can be switched by switching any one of the bias voltage Vb and bias voltage Vs or both of these voltages.

Sizes of MOS transistors of the V—V amplifier and V-I amplifier of each path, bias voltages when the path is selected and load impedances are all set identically ($202p_{11}$= $202n_{11}$=$202p_{12}$=$202n_{12}$=$202p_{22}$=$202n_{22}$, $202_{11}$=$202_{12}$= $202_{22}$, Vb$_{11}$=Vb$_{12}$=Vb$_{22}$, Vs$_{11}$=Vs$_{12}$=Vs$_{22}$, Z$_{11}$=Z$_L$). As a result, change of input impedance and output impedance when the gain is selected can be suppressed.

According to the present invention, changes of input impedance and output impedance of the amplifier due to the switching of gain can be suppressed, and therefore the variable gain amplifier which can realize high precision matching in the input and output sides may be realized. A high sensitivity wireless receiver can be formed by introducing such variable gain amplifier.

It is further understood by those skilled in the art that the foregoing description is a preferred embodiment of the disclosed device and that various changes and modifications may be made in the invention without departing from the spirit and scope thereof.

What is claimed is:

1. A variable gain amplifier comprising:
   a voltage-input/voltage-output amplifier;
   a voltage-input/current-output amplifier;
   a first path formed by cascade-connecting at least a stage of said voltage-input/voltage-output amplifier and a single stage of said voltage-input/current-output amplifier in this sequence and connected between an input terminal and an output terminal;
   a second path formed by a single stage of said voltage-input/current-output amplifier and connected between said input terminal and said output terminal;
   a load common to said first and second paths connected to said output terminal,
   wherein a gain can be switched by selecting and operating any one of said first path and the second path.

2. The variable gain amplifier according to claim 1, wherein said second path further has at least a stage of said voltage-input/voltage-output amplifier connected between said input terminal and said single stage of said voltage-input/current-output amplifier.

3. The variable gain amplifier according to claim 1, wherein even when any one of said first and second paths is selected, an input impedance viewed from said input terminal is almost identical.

4. The variable gain amplifier according to claim 3, wherein said second path further has at least a stage of said voltage-input/voltage-output amplifier connected between said input terminal and said single stage of said voltage-input/current-output amplifier.

5. The variable gain amplifier according to claim 1, wherein even when any one of said first and second paths is selected, an impedance viewed from said output terminal is almost identical.

6. The variable gain amplifier according to claim 5, wherein said second path further has at least a stage of said voltage-input/voltage-output amplifier connected between said input terminal and sold single stage of said voltage-input/current-output amplifier.

7. The variable gain amplifier according to claim 3, wherein said first and second paths are selected by controlling bias voltages given to control electrodes of transistors forming said voltage-input/voltage-output amplifier and said voltage-input/current-output amplifier, an element size of an input transistor connected to said input terminal, said input transistor being included in said transistors, is identical, and the bias voltage when the path is selected given to the control electrode of said input transistor is also identical.

8. The variable gain amplifier according to claim 4, wherein said first and second paths are selected by controlling bias voltages given to control electrodes of transistors forming said voltage-input/voltage-output amplifier and said voltage-input/current-output amplifier, an element size of an input transistor connected to said input terminal, said input transistor being included in said transistors, is identical, and the bias voltage when the path is selected given to the control electrode of said input transistor is also identical.

9. The variable gain amplifier according to claim 3, wherein at least one of said voltage-input/voltage-output amplifier and said voltage-input/current-output amplifier is formed of a cascode structure in which a transistor and a cascode transistor are cascade-connected, said first and second paths are selected by controlling bias voltages given to control electrodes of transistors forming said voltage-input/voltage-output amplifier and said voltage-input/ current-output amplifier or said cascode transistor, and an element size of an input transistor connected to said input terminal, said input transistor being included in said transistors, is identical, and the bias voltage when the path is selected given to the control electrode of said input transistor is also identical.

10. The variable gain amplifier according to claim 4, wherein at least one of said voltage-input/voltage-output amplifier and said voltage-input/current-output amplifier is formed of a cascode structure in which a transistor and a cascode transistor are cascade-connected, said first and second paths are selected by controlling bias voltages given to control electrodes of transistors forming said voltage-input/voltage-output amplifier and said voltage-input/ current-output amplifier or said cascode transistor, and an element sire of an input transistor connected to said input terminal, said input transistor being included in said transistors, is identical, and the bias voltage when the path is selected given to the control electrode of said input transistor is also identical.

11. The variable gain amplifier according to claim 3, wherein each of said voltage-input/voltage-output amplifier and said voltage-input/current-output amplifier is formed of a cancode structure in which a transistor and a cascode transistor are cascade-connected, said first and second paths are selected by controlling bias voltages given to at least any of the transistors and the cascode transistors forming said voltage-input/voltage-output amplifier and said voltage-input/current- output amplifier, an element size of an input transistor connected to said input terminal, said input transistor being included an said transistors, is identical, an element size of the input cascade transistor connected to said input transistor is also identical, the bias voltage when the path is selected given to the control electrode of said input transistor is identical, and the bias voltage when the path is selected given to the control electrode of said input cascade transistor is also identical.

12. The variable gain amplifier according to claim 4, wherein each of said voltage-input/voltage-output amplifier and said voltage-input/current-output amplifier is formed of a cascode structure in which a transistor and a cascode transistor are cascade-connected, said first and second paths are selected by controlling bias voltages given to at least any of the transistors and the cascode transistors forming said voltage-input/voltage-output amplifier and said voltage-input/current- output amplifier, an element size of an input transistor connected to said input terminal, said input transistor being included in said transistors, is identical, en element size of the input cascode transistor connected to said input transistor is also identical, the bias voltage when the path is selected given to the control electrode of said input transistor is identical, and the bias voltage when the path is selected given to the control electrode of said input cascode transistor is also identical.

13. The variable gain amplifier according to claim 5, wherein said first and second paths are selected by controlling bias voltages given to control electrodes of transistors forming said voltage-input/voltage-output amplifier and said voltage-input/current-output amplifier, an element size of an output transistor connected to said output terminal, said output transistor being included in said transistor, is identical, and the bias voltage when the path is selected given to the control electrode of said output transistor is also identical.

14. The variable gain amplifier according to claim 6, wherein said first and second paths are selected by controlling bias voltages given to control electrodes of transistors forming said voltage-input/voltage-output amplifier and said voltage-input/current-output amplifier, an element size of an output transistor connected to said output terminal, said output translator being included in said transistor, is identical, and the bias voltage when the path is selected given to the control electrode of said output transistor is also identical.

15. A differential variable gain amplifier comprising two variable gain amplifiers comprising a voltage-input/voltage-output amplifier:
   a voltage-input/current-output amplifier;
   a first path formed by cascade-connecting at least is stage of said voltage-input/voltage-output amplifier and a single stage of said voltage-input/current-output amplifier in this sequence and connected between an input terminal and an output terminal;
   a second path formed by a single stage of said voltage-input/current-output amplifier and connected between said input terminal and said output terminal;
   a load common to said first and second paths connected to said output terminal,
   wherein a gain can be switched by selecting and operating any one or said first path and the second path; and
   wherein the input terminals of said two variable gain amplifiers are conned to input a differential signal.

16. A differential variable gain amplifier comprising two variable gain amplifiers comprising a voltage-input/voltage-output amplifier;
   a voltage-input/current-output amplifier;
   a first path formed by cascade-connecting at least a stage of said voltage-input/voltage-output amplifier and a single stage of said voltage-input/current-output amplifier in this sequence and connected between an input terminal and an output terminal;
   a second path formed by a single stage of said voltage-input/current-output amplifier and connected between said input terminal and said output terminal;
   a load common to said first and second paths connected to said output terminal,
   wherein a gain can be switched by selecting and operating any one of said first path and the second path;
   wherein said second path further has at least a stage of said voltage-input/voltage-output amplifier connected between said input terminal and said single stage of said voltage-input/current-output amplifier; and
   wherein the input terminals of said two variable gain amplifiers are formed to input a differential signal.

17. A differential variable gain amplifier comprising two variable gain amplifiers comprising a voltage-input/voltage-output amplifier;
   a voltage-input/current-output amplifier;
   a first path formed by cascade-connecting at least a stage of said voltage-input/voltage-output amplifier and a single stage of said voltage-input/current-output amplifier in this sequence and connected between an input terminal and an output terminal;
   a second path formed by a single stage of said voltage-input/current-output amplifier and connected between said input terminal and said output terminal;
   a load common to said first and second paths connected to said output terminal,
   wherein a gain cans be switched by selecting and operating any one of said first path and the second path;
   wherein even when any one of said first and second paths is selected, an input impedance viewed from said input terminal is almost identical; and
   wherein the input terminals of said two variable gain amplifiers are formed to input a differential signal.

18. A differential variable gain amplifier comprising two variable gain amplifiers comprising a voltage-input/voltage-output amplifier;
   a voltage-input/current-output amplifier;
   a first path formed by cascade-connecting at least a stage of said voltage-input/voltage-output amplifier and a single stage of said voltage-input/current-output amplifier in this sequence and connected between an input terminal and an output terminal;
   a second path formed by a single stage of said voltage-input/current-output amplifier and connected between said input terminal and said output terminal;
   a load common to said first and second paths connected to said output terminal,
   wherein a gain can be switched by selecting and operating any one of said first path and the second path;
   wherein said second path further has at least a stage of said voltage-input/voltage-output amplifier connected between said input terminal and said single stage of said voltage-input/current-output amplifier; and
   wherein the input terminals of said two variable gain amplifiers are formed to input a differential signal.

19. A differential variable gain amplifier comprising two variable gain amplifiers comprising a voltage-input/voltage-output amplifier;
   a voltage-input/current-output amplifier;
   a first path formed by cascade-connecting at least a stage of said voltage-input/voltage-output amplifier and a single stage of said voltage-input/current-output amplifier in this sequence and connected between an input terminal and an output terminal;
   a second path formed by a single stage of said voltage-input/current-output amplifier and connected between said input terminal and said output terminal;
   a load common to said first and second paths connected to said output terminal, wherein a gain can be switched by selecting and operating any one of said first path and the second path;

wherein even when any one of said first and second paths is selected, an impedance viewed from said output terminal is almost identical; and wherein the input terminals of said two variable gain amplifiers are formed to input a differential signal.

20. A differential variable gain amplifier comprising two variable gain amplifiers comprising a voltage-input/voltage-output amplifier;

a voltage-input/current-output amplifier;

a first path formed by cascade-connecting at least a stage of said voltage-input/voltage-output amplifier and a single stage of said voltage-input/current-output amplifier in this sequence and connected between an input terminal and an output terminal;

a second path formed by a single stage of said voltage-input/current-output amplifier and connected between said input terminal and said output terminal;

a load common to said first and second paths connected to said output terminal, wherein a gain can be switched by selecting and operating any one of said first path and the second path;

wherein even when any one of said first and second paths is selected, an impedance viewed from said output terminal is almost identical; and wherein said second path further has at least a stage of said voltage-input/voltage-output amplifier connected between said input terminal and said single stage of said voltage-input/current-output amplifier; and wherein the input terminals of said two variable gain amplifiers are formed to input a differential signal.

* * * * *